(12) United States Patent
Huang et al.

(10) Patent No.: US 12,295,152 B2
(45) Date of Patent: May 6, 2025

(54) HIGH RUGGEDNESS HETEROJUNCTION BIPOLAR TRANSISTOR (HBT)

(71) Applicant: VISUAL PHOTONICS EPITAXY CO., LTD., Taoyuan (TW)

(72) Inventors: Chao-Hsing Huang, Taoyuan (TW); Yu-Chung Chin, Taoyuan (TW); Kai-Yu Chen, Taoyuan (TW)

(73) Assignee: VISUAL PHOTONICS EPITAXY CO., LTD., Taoyuan (TW)

( * ) Notice: Subject to any disclaimer, the term of this patent is extended or adjusted under 35 U.S.C. 154(b) by 0 days.

(21) Appl. No.: 18/438,442

(22) Filed: Feb. 10, 2024

(65) Prior Publication Data

US 2024/0222477 A1    Jul. 4, 2024

Related U.S. Application Data

(62) Division of application No. 17/148,709, filed on Jan. 14, 2021, now Pat. No. 11,929,427.

(30) Foreign Application Priority Data

Jan. 14, 2020  (TW) .................. 109101244

(51) Int. Cl.
| | | |
|---|---|---|
| *H10D 10/80* | (2025.01) | |
| *H01L 23/66* | (2006.01) | |
| *H03F 3/19* | (2006.01) | |
| *H03F 3/21* | (2006.01) | |
| *H10D 62/13* | (2025.01) | |
| *H10D 62/824* | (2025.01) | |

(52) U.S. Cl.
CPC ............. *H10D 10/80* (2025.01); *H01L 23/66* (2013.01); *H03F 3/19* (2013.01); *H03F 3/21* (2013.01); *H10D 62/137* (2025.01); *H10D 62/824* (2025.01); *H01L 2223/6644* (2013.01)

(58) Field of Classification Search
CPC .... H10D 10/80; H10D 62/137; H10D 62/824; H10D 10/821; H01L 23/66; H01L 2223/6644; H01L 29/0821; H01L 29/205; H01L 29/7371; H01L 29/737; H03F 3/19; H03F 3/21
See application file for complete search history.

(56) References Cited

U.S. PATENT DOCUMENTS

| | | | |
|---|---|---|---|
| 6,563,145 B1 * | 5/2003 | Chang .................. | H10D 10/021 257/E29.189 |
| 6,881,988 B2 | 4/2005 | Niwa et al. | |

(Continued)

FOREIGN PATENT DOCUMENTS

| | | |
|---|---|---|
| TW | 201535720 | 9/2015 |
| TW | 201947770 | 12/2019 |

OTHER PUBLICATIONS

Taiwanese Office Action for Taiwanese Patent Application No. 110101508 dated Nov. 5, 2021.

*Primary Examiner* — S M Sohel Imtiaz
(74) *Attorney, Agent, or Firm* — CKC & Partners Co., LLC

(57) ABSTRACT

Provided is a high ruggedness heterojunction bipolar transistor (HBT), including a substrate, a sub-collector layer, collector layer, a base layer, and an emitter layer. The collector layer includes a InGaP layer or a wide bandgap layer. The collector layer includes III-V semiconductor material. The bandgap of the wide bandgap layer is greater than that of GaAs.

19 Claims, 12 Drawing Sheets

(56) References Cited

U.S. PATENT DOCUMENTS

| | | | |
|---|---|---|---|
| 2003/0136956 A1* | 7/2003 | Niwa | H10D 10/821 |
| | | | 257/E29.189 |
| 2003/0213973 A1* | 11/2003 | Yoshioka | H10D 10/021 |
| | | | 257/E29.189 |
| 2004/0065898 A1* | 4/2004 | Chau | H10D 10/821 |
| | | | 257/E29.189 |
| 2005/0145884 A1* | 7/2005 | Nogome | H10D 10/821 |
| | | | 257/E29.189 |
| 2007/0120148 A1 | 5/2007 | Nogome | |
| 2007/0145412 A1* | 6/2007 | Murayama | H10D 10/821 |
| | | | 257/E29.189 |
| 2008/0116489 A1* | 5/2008 | Niwa | H10D 10/821 |
| | | | 257/E29.189 |
| 2013/0285120 A1* | 10/2013 | Zampardi, Jr. | H10D 62/137 |
| | | | 257/586 |
| 2015/0014632 A1* | 1/2015 | Kim | H10K 71/50 |
| | | | 438/312 |
| 2016/0049502 A1* | 2/2016 | Chin | H10D 10/021 |
| | | | 257/197 |

\* cited by examiner

HIGH RUGGEDNESS HETEROJUNCTION BIPOLAR TRANSISTOR (HBT)

CROSS-REFERENCE TO RELATED APPLICATION

The present application is a Divisional Application of the U.S. application Ser. No. 17/148,709, filed Jan. 14, 2021 which claims priority to Taiwan Application Serial Number 109101244, filed Jan. 14, 2020, all of which are herein incorporated by reference in their entireties.

TECHNICAL FIELD

The technical field relates to a bipolar transistor, especially a high ruggedness heterojunction bipolar transistor (HBT).

BACKGROUND

In the applications of wireless communication devices or fifth-generation mobile communication devices, the efficiency, RF performance, linearity and ruggedness of a power amplifier (PA) need to be improved.

The efficiency of a PA can be effectively improved by increasing the operating voltage or operating current. For example, the operating voltage or current of a PA is improved through circuit design. In addition, the efficiency of a PA can also be improved by adjust the structure and/or material of the epitaxial layer of a heterojunction bipolar transistor (HBT).

However, when the HBT operates at a high voltage or a high current, the HBT is prone to damage due to excessive power. For example, when the PA and the antenna are not impedance matched to each other, the excessive power bounced back will cause the ruggedness of the HBT and the PA to deteriorate. Therefore, how to effectively improve the ruggedness of an HBT under high voltage or high current (i.e., high power density) operation is an important topic.

Referring to U.S. Pat. No. 6,881,988 (hereinafter referred to as Niwa "988"), the collector region includes a first collector layer, a second collector layer and a third collector layer. The third collector layer is located between the first collector layer and the second collector layer. The first collector layer is made of InGaP. The first collector layer contains InGaP with a natural superlattice. A third collector layer is located above the first collector layer, and the doping concentration of the third collector layer is higher than that of the second collector layer.

Niwa "988" discloses the difference between HBTs with and without the third collector layer. When the third collector layer is provided in the HBT, the potential at the interface between the first collector layer and the third collector layer will become lower. As a result, the knee voltage (i.e., the voltage at the junction between the saturation region and the operating region) of the HBT's current-voltage curve can be reduced. In addition, the ratio of electrical fields in the first and third collector layers can be adjusted to increase or improve the breakdown voltage by means of adjusting the thickness or doping concentration of the third collector layer.

In general, when In atoms and Ga atoms in InGaP is high ordering in a group III atomic layer, the formed spontaneous polarization effect (i.e., the ordering effect) is also stronger, and the bandgap of InGaP becomes smaller as well as the stronger spontaneous polarization electric field is formed. According to the degree of atomic arrangement in the InGaP layer, such as In atoms and Ga atoms arranged in a group III atomic layer, the material of the InGaP layer can be roughly divided into a high ordering InGaP material and a disordering InGaP material. For the high ordering InGaP material, such as the InGaP layer having the natural superlattice, the bandgap of InGaP will be smaller, and the formed spontaneous polarization electric field will be stronger. The stronger spontaneous polarization electric field is easier to deplete the carriers at the epitaxial layer on the high ordering InGaP layer or at the interface between the high ordering InGaP layer and the epitaxial layer formed on the high ordering InGaP layer. When the carriers in a region are depleted by the spontaneous polarization electric field, the resistance of the region will increase, especially the interface resistance will increase more easily. This situation is not conductive to improving the efficiency or RF performance of the HBT. Besides, the smaller the bandgap of the material is, the more limited the improvement in the ruggedness or breakdown voltage of the HBT is.

As the first collector layer of Niwa "988" is made of InGaP with a natural superlattice, the first collector layer is made of InGaP will have the stronger ordering effect (spontaneous polarization effect). Therefore, the spontaneous polarization electric field of the first collector layer is relatively strong, and the bandgap thereof is small.

Since the first collector layer will generate a strong spontaneous polarization electric field, Niwa "988" further provides a third collector layer with a high doping above the first collector layer to avoid the increase of the interface resistance between the first collector of InGaP and the second collector layer of GaAs, thereby preventing the knee voltage of the current-voltage curve of the HBT from increasing.

The electric field formed by the first collector layer will deplete the carriers in the second collector layer and the carriers at the interface between the second collector layer and the first collector layer. Therefore, the electron potential barrier of the depleted region will rise, and the resistance of the collector will rise such that the RF performance and efficiency of the HBT are adversely affected.

Especially when the HBT is operated at a relatively high current density, since the electron potential barrier of the depleted region becomes higher, the electrons are easily blocked by the electron potential barrier, and cause electron accumulation such that it is easy to make the electron potential barrier in the depleted region higher. This situation makes it more difficult for electrons to pass, resulting in degradation of the HBT I-V curve and increase in knee voltage. As such, it will adversely affect the efficiency or RF performance of the power amplifier.

SUMMARY

According to the heterojunction bipolar transistor (HBT) disclosed in the prior art, although the breakdown voltage of the HBT can be increased, the improvement in the RF performance or ruggedness of the HBT is relatively limited, especially when applied to a higher frequency or a higher current density, the efficiency or RF performance of the HBT of the prior art are more prone to degradation or attenuation.

In addition, since the high ordering InGaP layer in the prior art has a small bandgap, the improvement in the ruggedness or breakdown voltage of the HBT is relatively limited.

Moreover, in order to improve the RF performance of the HBT, the collector transient time (Tc) for electrons to pass through the collector layer needs to be shortened such that the thickness of the collector layer also need to be thinner. However, the thinning of the thickness of the collector layer may result in a decrease in the breakdown voltage, thereby causing the output power of the power amplifier to be easily limited. Accordingly, a material with a wide bandgap needs to be introduced into the collector layer to maintain a proper breakdown voltage and the output power or ruggedness of the power amplifier.

Therefore, it is necessary to provide a HBT, which not only has a certain or higher breakdown voltage, but also need to improve efficiency, linearity, RF performance or ruggedness such that the HBT is suitable for operation at higher frequencies and/or high currents and high voltages.

DESCRIPTION OF THE EMBODIMENTS

Figure 1:
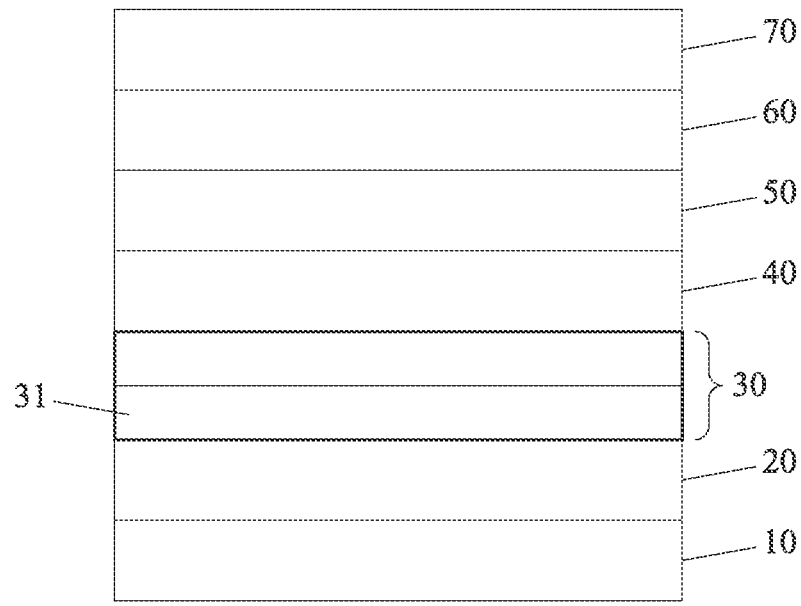
FIG. 1 is a schematic diagram of the heterojunction bipolar transistor (HBT) according to the first embodiment of the present disclosure.

The embodiment of the present disclosure is described in detail below with reference to the drawings and element symbols, such that persons skilled in the art is able to implement the present application after understanding the specification of the present disclosure.

Specific examples of components and arrangements are described below to simplify the present disclosure. These are, of course, merely examples and they are not intended to limit the scope of the present disclosure. In the present disclosure, for example, when a first epitaxial layer formed above or on a second epitaxial layer, it may include an exemplary embodiment in which the first epitaxial layer is in direct contact with the second epitaxial layer, or it may include an exemplary embodiment in which other elements or epitaxial layers are formed between thereof, such that the first epitaxial layer is not in direct contact with the second epitaxial layer. In addition, repeated reference numerals and/or notations may be used in different embodiments, these repetitions are only used to describe some embodiments simply and clearly, and do not represent a specific relationship between the different embodiments and/or structures discussed.

Further, spatially relative terms, such as "underlying," "below," "lower," "overlying," "above," "upper" and the like, may be used herein for ease of description to describe one element or feature's relationship to another element(s) or feature(s) as illustrated in the figures and/or drawings. The spatially relative terms are intended to encompass different orientations of the device in use or operation in addition to the orientation depicted in the figures and/or drawings.

Moreover, certain terminology has been used to describe embodiments of the present disclosure. For example, the terms "one embodiment," "an embodiment," and "some embodiments" mean that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of the present disclosure are not necessarily all referring to the same embodiment.

Furthermore, the particular features, structures or characteristics may be combined in any suitable manner in one or more embodiments of the present disclosure. Further, for the terms "including", "having", "with", "wherein" or the foregoing transformations used herein, these terms are similar to the term "comprising" to include corresponding features.

In addition, a "layer" may be a single layer or a plurality of layers; and "a portion" of an epitaxial layer may be one layer of the epitaxial layer or a plurality of adjacent layers.

FIG. 1 is a schematic diagram of the heterojunction bipolar transistor (HBT) according to the first embodiment of the present disclosure.

As shown in FIG. 1, the first embodiment is an exemplary structure of the HBT. According to the first embodiment, the HBT includes a substrate 10, a sub-collector layer 20, a collector layer 30, a base layer 40, an emitter layer 50, an emitter cap layer 60 and an ohmic contact layer 70.

The collector layer 30 includes an InGaP layer 31. The bandgap of the InGaP layer is greater than 1.86 eV, 1.87 eV, 1.88 eV, 1.89 eV, 1.90 eV or 1.91 eV, so the ordering effect of the InGaP layer 31 is low. If the arrangement of atoms in the InGaP layer 31 is disordering or belongs to the lower ordering effect (i.e., the spontaneous polarization effect), the generated spontaneous polarization electric field of the InGaP layer 31 is low such that the number of depleted carriers in the semiconductor layer close to the InGaP layer will decrease. For example, the collector layer may also include one or multiple collector layers, and the one or multiple collector layers are formed on the InGaP layer. Since the spontaneous polarization electric field generated by the low ordering InGaP layer is weaker, the number of carriers in the one or multiple collectors depleted by the weak electric field is also reduced such that the number of carriers at the interface between the collector layer and the InGaP layer will be reduced due to the weak electric field. Therefore, the number of carriers in the one or multiple collector layers and the carriers at the interface between the collector layer and the InGaP layer will be considerably reduced such that the collector resistance will not increase easily, and the RF performance or efficiency of the HBT is not easily degraded.

when the HBT is operated at a relatively high current density, since the number of depleted carriers is fewer, the electron potential barrier is not easy to be high, so the massive electron accumulation is less likely to occur. Consequently, it helps to maintain or improve the efficiency or RF performance of the power amplifier.

On the other hand, in the prior art, the arrangement of the atoms in the first collector layer contacting the sub-collector region is high ordering, i.e., the first collector layer has the high ordering effect. The relatively small bandgap of the first collector layer in the prior art is harmful to improving the breakdown voltage or the ruggedness of the HBT. Compared with the prior art, since the arrangement of atoms in the InGaP layer of the first embodiment is disordering or belongs to the low ordering effect, i.e., the InGaP layer of the first embodiment has the low ordering effect, the bandgap of the InGaP layer is larger. As a result, it helps to improve the breakdown voltage or ruggedness of the HBT.

In addition, the bandgap of the InGaP layer is larger (i.e., the wide bandgap layer described below). When there is a GaAs layer directly formed or above the InGaP layer, the InGaP layer (wide bandgap layer) and the GaAs layer will form a larger conduction band discontinuity. When the conduction band is discontinuous and at normal operating current or operating power, the number of electrons that can be blocked by the conduction band discontinuity is relatively limited, so the performance of the HBT will not be affected significantly. When the operating current or operating power of the HBT becomes very high, the conduction band discontinuity can block more electrons and cause the accumulation of electrons, thereby changing the electric field in the area and increasing the electron barrier. In this way, the current is not too high to damage the HBT, thereby ensuring the ruggedness of the HBT.

Figure 2:
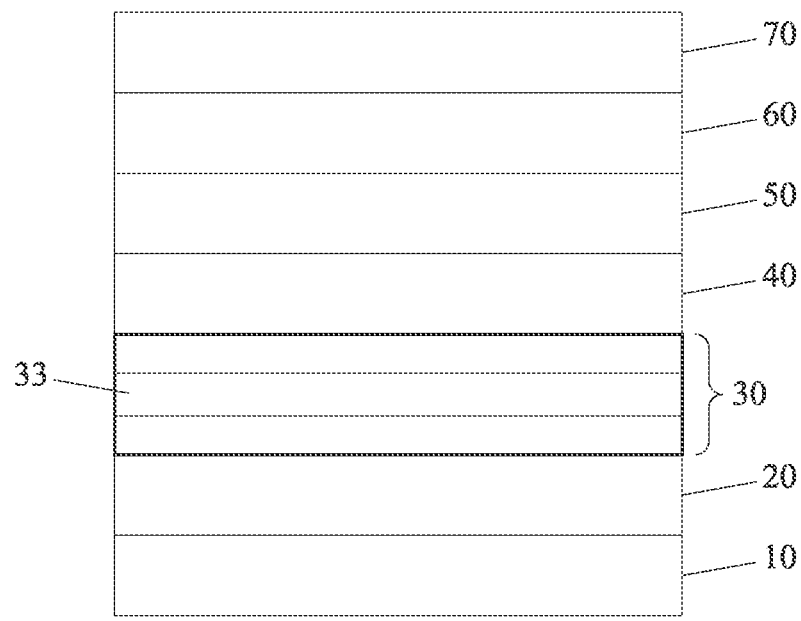
FIG. 2 is a schematic diagram of a HBT according to the second embodiment of the present disclosure.

Referring to FIG. 2, FIG. 2 is a schematic diagram of the HBT according to the second embodiment of the present disclosure. As shown in FIG. 2, the HBT structure of the second embodiment is substantially the same as that of the first embodiment, but the collector layer of the second embodiment includes a wide bandgap layer 33, that is, the InGaP layer 31 is replaced by the wide bandgap layer 33, and the bandgap of the wide bandgap layer 33 is greater than that of GaAs. In the second embodiment, the material of the wide bandgap layer 33 includes InGaAsP (or an InGaAsP layer).

Although the bandgap of the InGaAsP layer is smaller than that of the InGaP layer, the bandgap of the InGaAsP layer may also be similar to that of the InGaP layer. In this way, it helps to improve the ruggedness of the HBT.

Since the ordering effect of the InGaAsP layer and the spontaneous polarization electric field generated by the InGaAsP layer are smaller than those of the InGaP layer, the resulting resistance is also smaller. Therefore, it will help to improve the efficiency and RF performance of the HBT or maintain the ruggedness.

Figure 3:
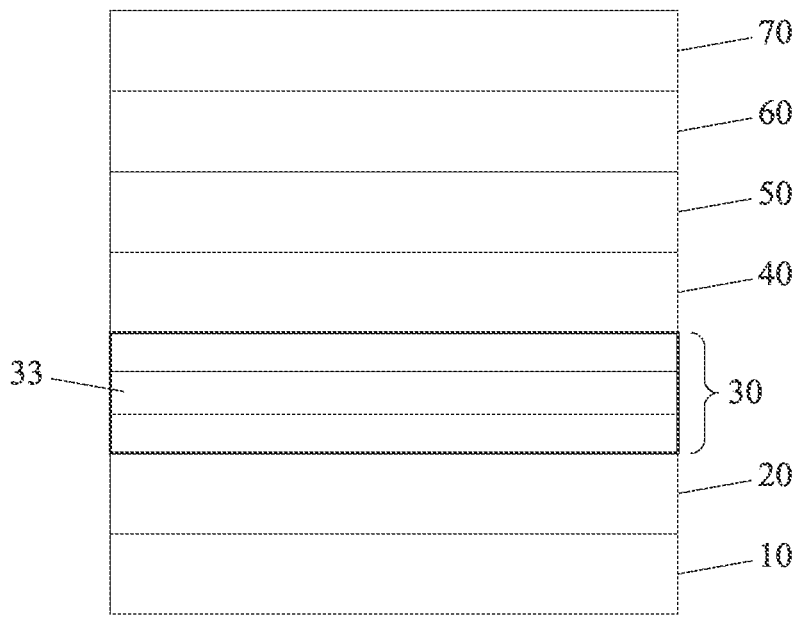
FIG. 3 is a schematic diagram of a HBT according to the third embodiment of the present disclosure.

Referring to FIG. 3, FIG. 3 is a schematic diagram of the HBT according to the third embodiment of the present disclosure.

As shown in FIG. 3, the HBT structure of the third embodiment is substantially the same as that of the second embodiment, but in the third embodiment, the material of the wide bandgap layer 33 is InAlGaP (or an InAlGaP layer). The bandgap of the InAlGaP layer is greater than that of the InGaP layer. In improving the ruggedness of the HBT, the InAlGaP layer is better than the InGaP layer. However, in general, the high bandgap material has higher resistance, and the improvement of the HBT performance is relatively limited.

In addition, the wide bandgap layer may include InGaAsP or InAlGaP. The wide bandgap layer may also include at least one material selected from the group consisting of InGaPN, InGaPSb, InGaPBi, InGaAsP, InGaAsPN, InGaAsPSb, InGaAsPBi, InAlGaP, InAlGaPN, InAlGaPSb and InAlGaPBi. Besides, adding elements such as N, Sb and Bi to the material of the wide bandgap layer can adjust the discontinuity of the conduction band or the discontinuity of the valence band between the material of the wide bandgap layer and other materials.

The ratio of the thickness of the InGaP layer or wide bandgap layer to the total thickness of the collector layer is between 1 and 0.01, and the specific thickness ratio may be 2/3, 1/2, 1/3, 1/4, 1/5, 1/10, 1/20, 1/30, 1/40 or 1/50.

When the material of the InGaP layer with the lower ordering effect, the depletion of carriers in the area above the InGaP layer or at the interface of the InGaP layer can be reduced, and the increase of the interface resistance can be avoided so as to improve the performance of the power amplifier. Similarly, the spontaneous polarization effect of the InGaAsP layer or InAlGaP layer is weaker, and the performance of the power amplifier will also be improved or enhanced.

Figure 4:
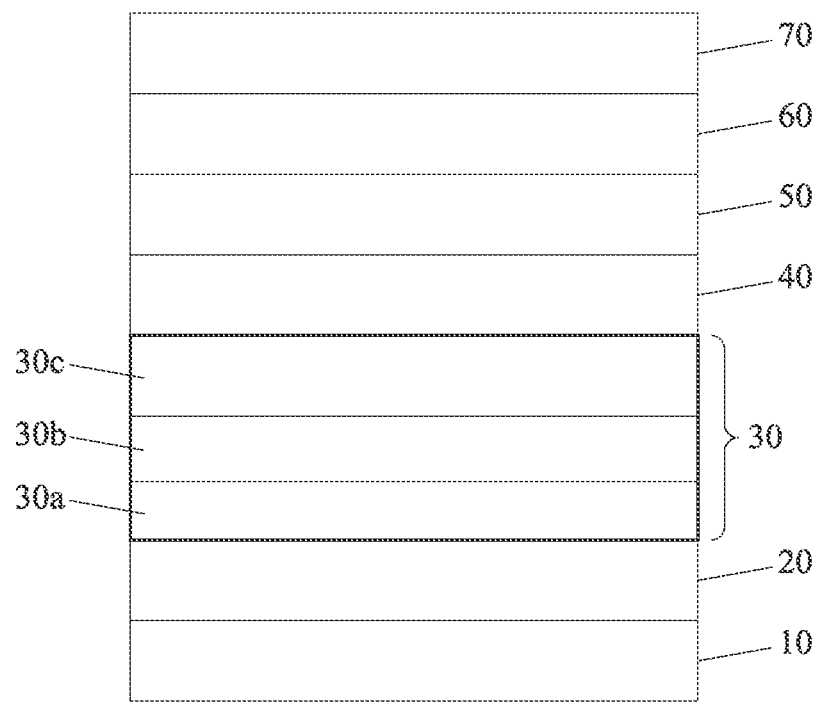
FIG. 4 is a schematic diagram of a HBT according to the fourth embodiment of the present disclosure.

Referring to FIG. 4, FIG. 4 is a schematic diagram of the HBT according to the fourth embodiment of the present disclosure. Any one of the first embodiment to the third embodiment can be incorporated to or integrated into the structure of the fourth embodiment. As shown in FIG. 4, the collector layer of the fourth embodiment further includes a three-layer structure (including a bottom layer 30a, a middle layer 30b and a top layer 30c). The middle layer 30b is between the bottom layer 30a and the top layer 30c.

According to the fourth embodiment, the bottom layer is an InGaP layer, and the middle layer is a high doping concentration collector layer. The bandgap of the bottom layer (i.e., the InGaP layer) of the collector layer is also greater than 1.86 eV or the photoluminescence (PL) peak wavelength of the InGaP layer is less than 667 nm, and the doping concentration of the middle layer is higher than that of the top layer. The material of the middle layer may be at least one material selected from the group consisting of GaAs, InGaP and InGaAsP. In the embodiment where the bottom layer of the collector layer is a wide bandgap layer, the material of the middle layer above the wide bandgap layer may be at least one material selected from the group consisting of GaAs, InGaP, InGaPN, InGaPSb, InGaPBi, InGaAsP, InGaAsPN, InGaAsPSb, InGaAsPBi, InAlGaP, InAlGaPN, InAlGaPSb and InAlGaPBi.

Since the bandgap of the InGaP layer is greater than 1.86 eV or the PL peak wavelength is less than 667 nm, even if the doping concentration of the middle layer is as high as that of the third collector layer of U.S. Pat. No. 6,881,988, the collector resistance of the fourth embodiment is smaller than that of U.S. Pat. No. 6,881,988. The reduced collector resistance helps to improve the efficiency, power or RF performance of the power amplifier.

Since the number of carriers (i.e., the carriers in the highly doped collector layer), on the InGaP layer is less depleted, the doping concentration of the high doping concentration collector layer can be at a relatively low concentration (e.g., less than $3.0\times10^{18}$ cm$^{-3}$), and still achieve the purpose of reducing collector resistance.

When the doping concentration of the high doping concentration collector layer becomes lower, the electric field of the high doping concentration collector layer also becomes weak so as to help improve the breakdown voltage or ruggedness.

The InGaP layer of the first embodiment may be used in conjunction with any material of the wide bandgap layer. For example, the collector layer is formed by forming an InGaP layer first and then forming a wide bandgap layer on the InGaP layer. Alternatively, the collector layer is formed by forming a wide bandgap layer first and then forming an InGaP layer on the wide bandgap layer.

One of the first to fourth embodiments further includes a bandgap graded layer 80. The bandgap graded layer is arranged in or on the collector layer 30. Please refer to the fifth embodiment to seventh embodiment for some embodiments of the bandgap graded layer 80.

Figure 5:
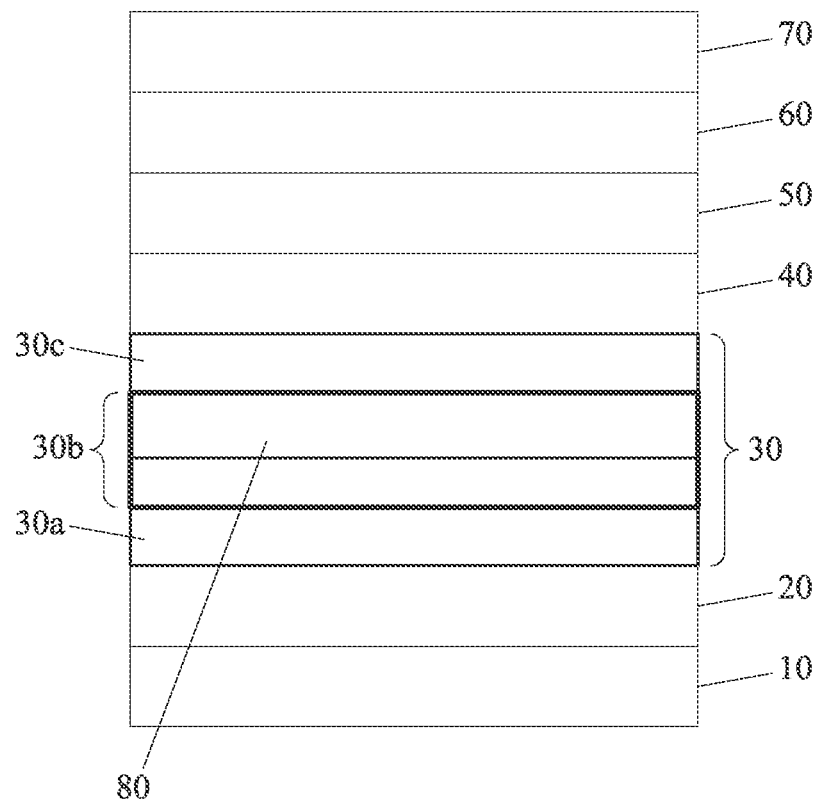
FIG. 5 is a schematic diagram of a HBT according to the fifth embodiment of the present disclosure.

Refer to FIG. 5, FIG. 5 is a schematic diagram showing the HBT according to the fifth embodiment of the present disclosure.

According to the fifth embodiment, the bandgap graded layer 80 is provided in part of or all of the collector layer 30. For example, the bandgap graded layer 80 is located in the middle layer 30*b*.

Figure 6:
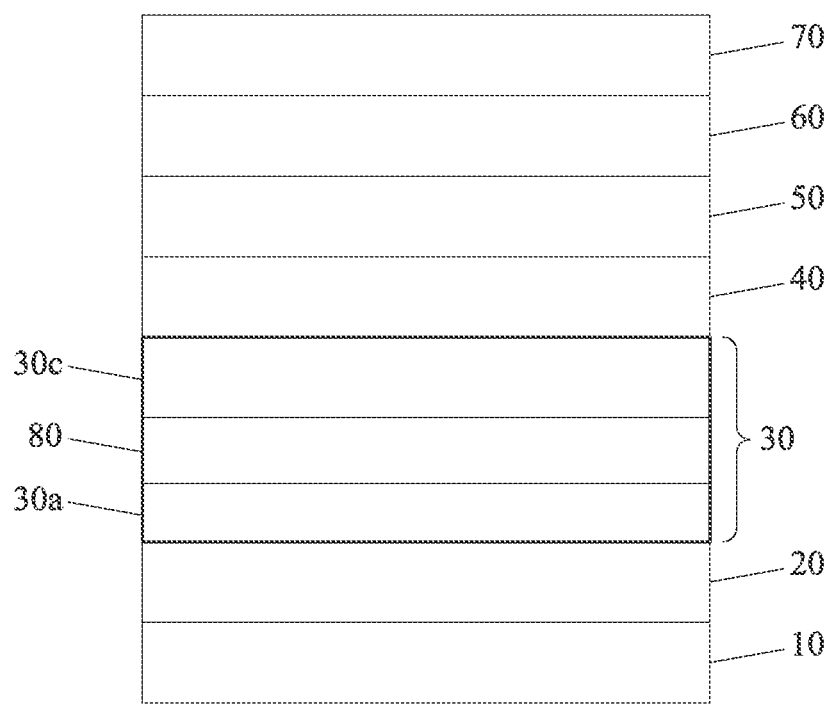
FIG. 6 is a schematic diagram of a HBT according to the sixth embodiment of the present disclosure.

Refer to FIG. 6, FIG. 6 is a schematic diagram showing the HBT according to the sixth embodiment of the present disclosure.

According to the sixth embodiment, the bandgap graded layer 80 replaces the middle layer 30*b* such that the bandgap graded layer 80 is located between the top layer and the bottom layer (InGaP layer).

Figure 7:
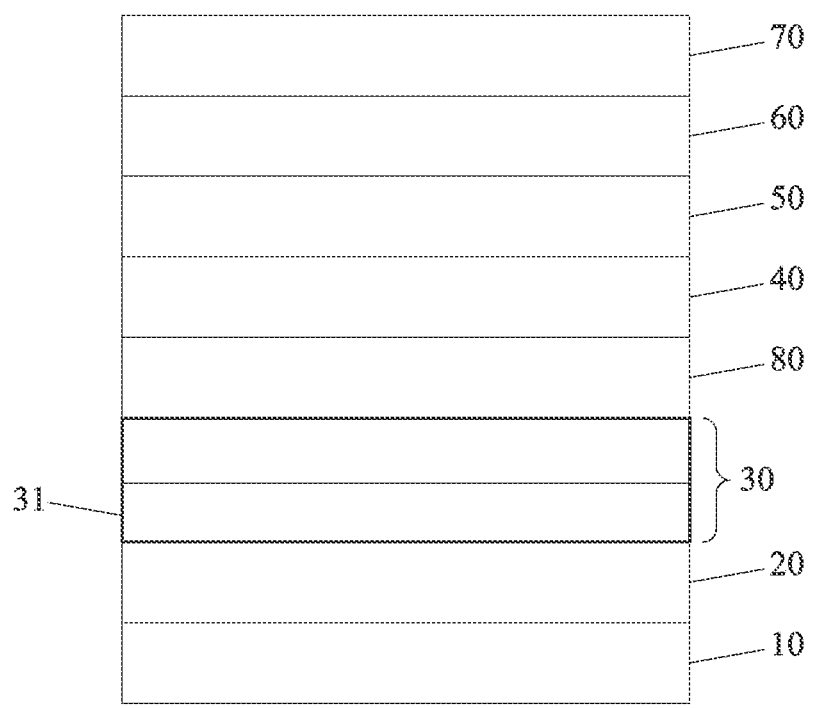
FIG. 7 is a schematic diagram of a HBT according to the seventh embodiment of the present disclosure, wherein the second lower spacer layer is located between a lower DBR layer and an oxidation layer.

Referring to FIG. 7, FIG. 7 is a schematic diagram showing the HBT according to the seventh embodiment of the present disclosure.

According to the seventh embodiment, the bandgap graded layer 80 is located on the collector layer 30.

The discontinuity of the conduction band or the discontinuity of the valence band "between the InGaP layer and the top layer," "between the InGaP layer and the middle layer," "between the wide bandgap layer and the top layer" or "between the wide bandgap layer and the middle layer" is adjusted by the configuration of the bandgap graded layer so as to help increase the breakdown voltage or ruggedness or to reduce the resistance. The bandgap variation of the bandgap graded layer includes linear, nonlinear, step-like or a combination thereof, and the material of the bandgap graded layer may include GaAs, AlGaAs, InGaAsP, InAlGaP or other suitable materials.

Any one of the first embodiment and the fourth embodiment may be used in conjunction with any one or some of the fifth embodiment to seventh embodiment (graded concentration).

Figure 8:
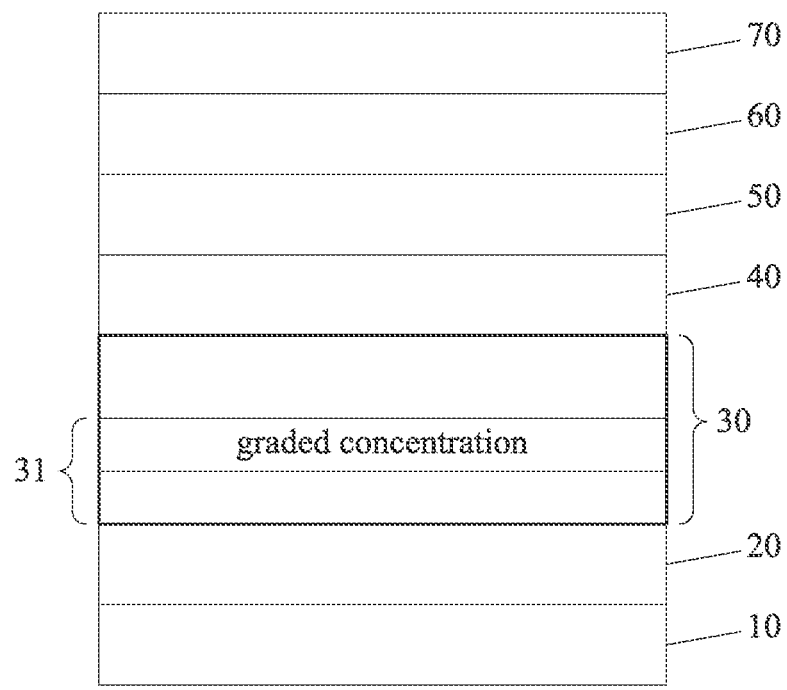
FIG. 8 is a schematic diagram of a HBT according to the eighth embodiment of the present disclosure.

Referring to FIG. 8, FIG. 8 is a schematic diagram showing the HBT according to the eighth embodiment of the present disclosure.

The eighth embodiment provides a means of graded concentration, which can be incorporated or applied to the above embodiments or applied to other embodiments according to the actual needs.

In some embodiments, the concentration of the InGaP layer 31, the concentration of the middle layer or the concentration of the wide bandgap layer 33 may be a graded concentration. The graded concentration can be provided in part of or the entire of the InGaP layer 31, part of or the entire of the middle layer, or part of or the entire of the wide bandgap layer 33. For example, the graded concentration of the InGaP layer 31 may mean that the doping concentration of the InGaP will increase in the direction of the sub-collector layer. The graded concentration may be a linear change, a nonlinear change, a step-like change or a combination thereof to help improve the HBT breakdown voltage or ruggedness.

In some embodiments, the doping graded concentration and the graded bandgap may be used in conjunction with each other. In the doping graded concentration, the dopant can be an N-type material.

Figure 9:
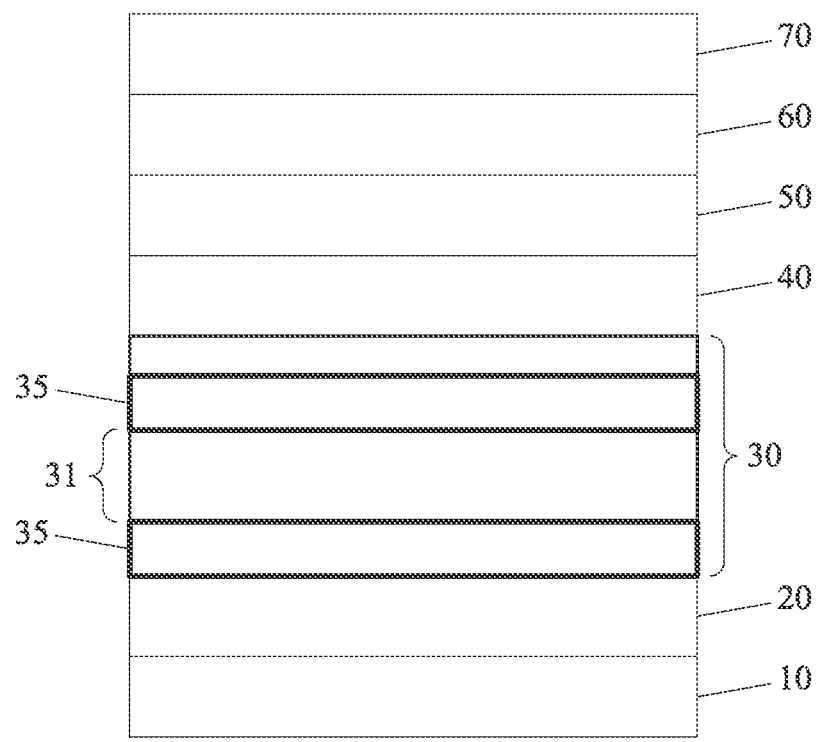
FIG. 9 is a schematic diagram of a HBT according to the ninth embodiment of the present disclosure.

Referring to FIG. 9, FIG. 9 is a schematic diagram showing the HBT according to the ninth embodiment of the present disclosure.

Any one of the first to eighth embodiments may further incorporate or apply the high-concentration InGaP layer 35 of the ninth embodiment. The high-concentration InGaP layer 35 may be disposed on and/or beneath the InGaP layer 31. Alternatively, the high-concentration InGaP layer 35 may be disposed on and/or beneath the wide bandgap layer.

FIG. 9 is an example of the first embodiment. As shown in FIG. 9, the high-concentration InGaP layer 35 is disposed on and beneath the InGaP layer 31.

Since a high-concentration InGaP layer is provided in the collector layer, the resistance of the collector layer is reduced or the ruggedness of the HBT is improved. In addition, the high-concentration InGaP layer has a higher doping concentration than the InGaP layer.

One of the first to fourth embodiments may incorporate the graded bandgap, the graded concentration, the high-concentration InGaP or a combination thereof according to different needs. For example, the (doping) concentration of InGaP layer is graded, and high doping concentration InGaP layer is further added on and/or beneath InGaP layer. In addition, an epitaxial layer (such as GaAs) with a high doping concentration or a graded concentration and/or a bandgap graded layer with a high doping concentration or a graded concentration is formed above the InGaP layer.

The InGaP layer having the lower ordering effect can reduce the depletion of carriers on the InGaP layer, avoid causing the collector resistance to rise and forming a significant negative impact on the performance of the power amplifier, or prevent the semiconductor layer above the InGaP layer from being affected by the electric field formed by the InGaP layer in order to overcome the high design complicity derived from the depletion of the carriers. Therefore, the overall performance or ruggedness of the HBT and the power amplifier can be enhanced.

Therefore, in an embodiment of the present disclosure, in order to determine the atomic ordering effect in the InGaP layer, the photoluminescence (PL) spectroscopy is used for evaluation, and the radiation wavelength of the "material under test" is measured at room temperature. In addition, the "material under test" is lattice-matched to the substrate. In this method, the material of the InGaP layer with a thickness of several hundred nanometers is epitaxially grown on a substrate by the same growth condition as the InGaP layer. When the material of the InGaP layer has the higher ordering effect, its bandgap is relatively lower, so the PL peak wavelength of the emitter material is relatively longer as compared with the lower ordering effect emitter materials when the PL measurement is performed.

Figure 10:
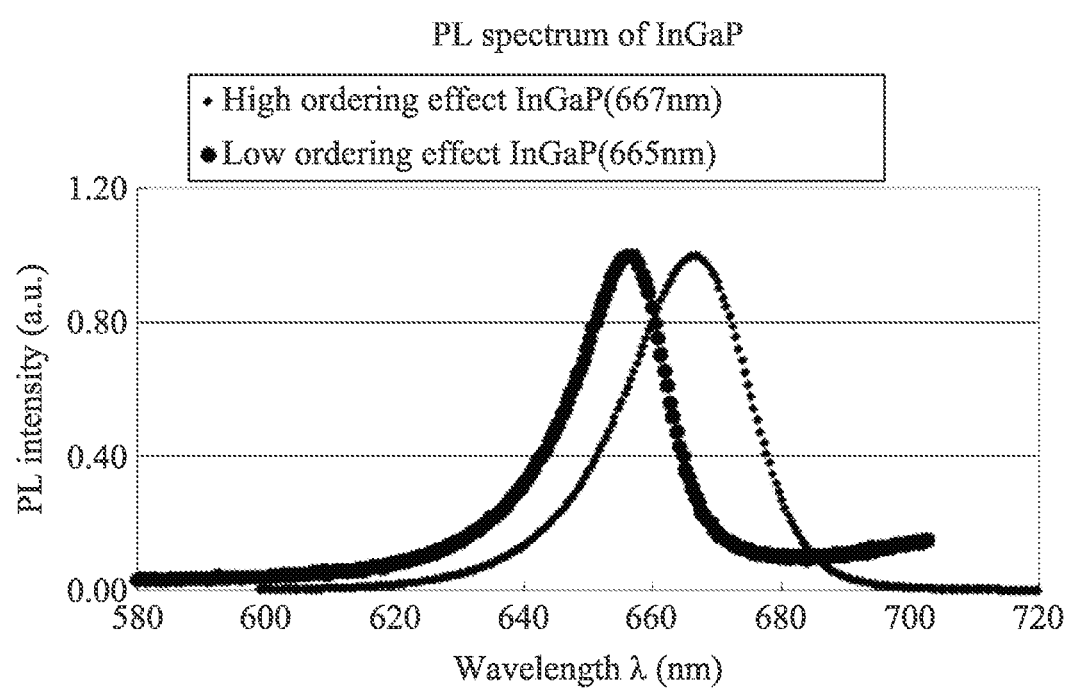
FIG. 10 is a graph showing a photoluminescence (PL) spectrum of InGaP measured by photoluminescence spectroscopy.

FIG. 10 shows the PL spectrum of InGaP measured by PL spectroscopy. Since InGaP with higher ordering effect has a lower bandgap, the PL peak wavelength is at about 667 nm. However, since InGaP with a lower ordering effect has a larger bandgap, the PL peak wavelength is shorter at about 655 nm (Eg=1.89 eV). In general, in the case of lower ordering effect, the PL peak wavelength of InGaP can be as short as 640 nm (Eg=1.94 eV). In order to avoid a strong spontaneous polarization electric field due to higher ordering effect, the PL peak wavelength of the collector layer composed of InGaP is below 667 nm, 666 nm, 664 nm, 662 nm, 660 nm, 658 nm, 656 nm, 654 nm, 652 nm, 650 nm or 648 nm.

Figure 11:
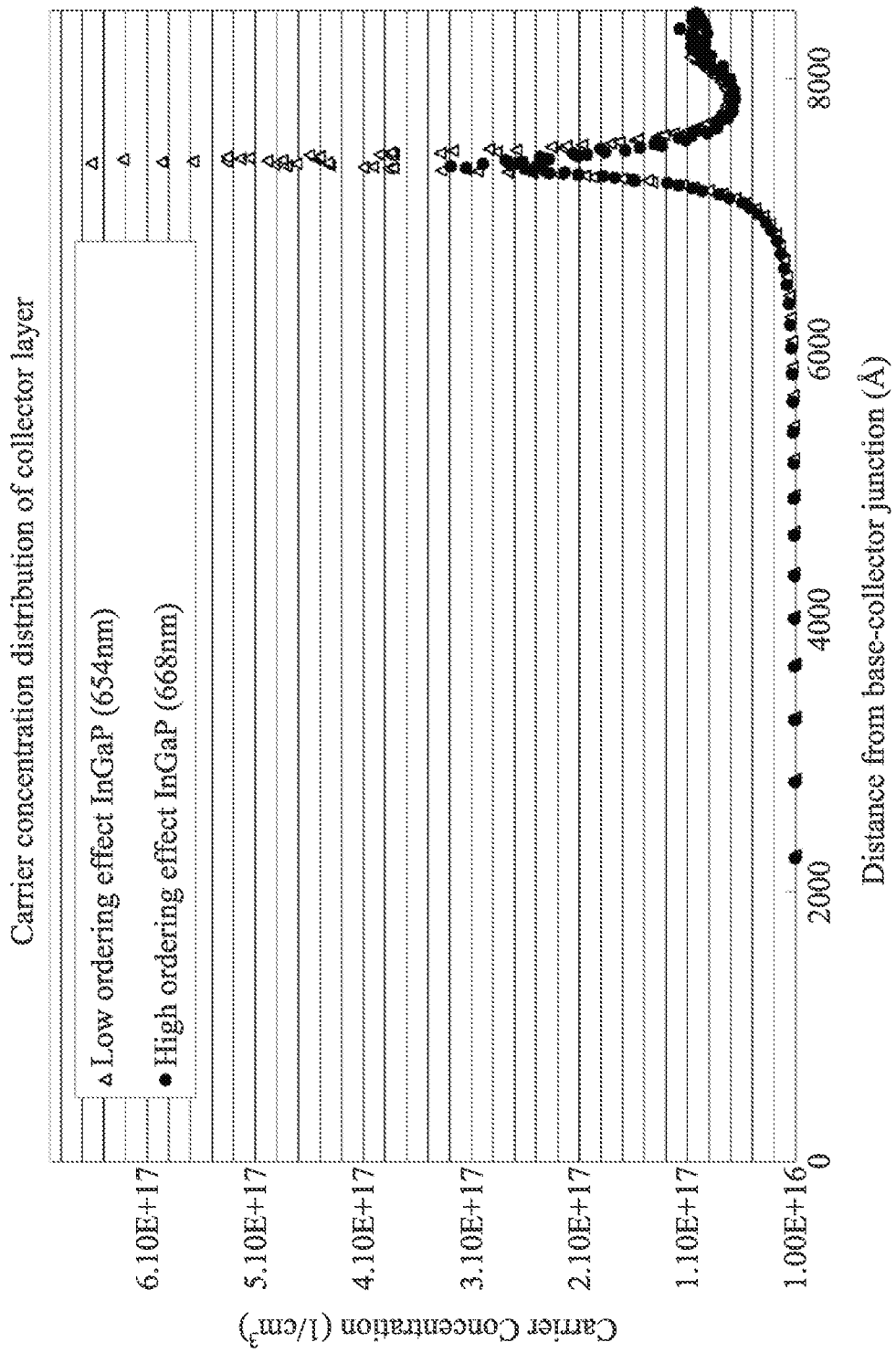
FIG. 11 is a comparison diagram showing the carrier concentration distribution of the collector layer of the HBT of the present disclosure and the carrier concentration distribution of the collector layer of the prior art HBT.
Figure 12:
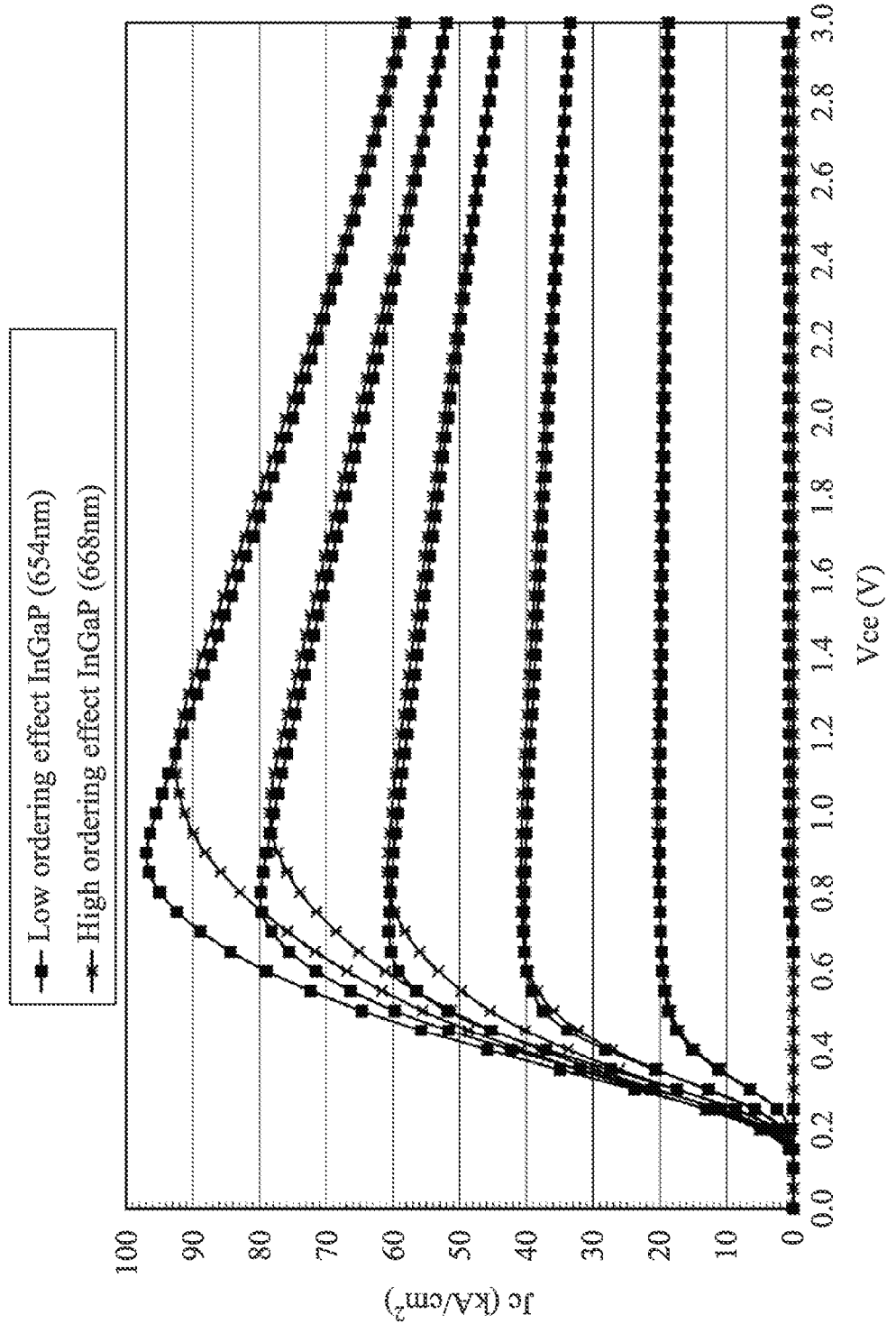
FIG. 12 is a comparison diagram showing the current-voltage (I-V) characteristics of the common emitter of the collector layer of the HBT of the present disclosure and the I-V characteristics of the common emitter of the prior art HBT.

FIG. 11 is a comparison diagram showing the carrier concentration distribution of the collector layer of the HBT of one embodiment of the present disclosure and the carrier concentration distribution of the collector layer of the prior art HBT. The diagram of the carrier concentration distribution of the collector layer is measured by the C-V measurement method. FIG. 12 is a comparison diagram showing the current-voltage (I-V) characteristics of the common emitter of the collector layer of the HBT of one embodiment of the present disclosure and the I-V characteristics of the common emitter of the prior art HBT. The structure of the HBT of an embodiment of the present disclosure is the same structure as the structure of the HBT of the prior art, as shown in FIG. 4. The present disclosure is different from the prior art only in the degree of ordering effect of the InGaP layer at the bottom layer of the collector layer. That is, the PL peak wavelength of the InGaP layer in the embodiment of the present disclosure is 654 nm (the bottom layer of the collector layer), while the PL peak wavelength of the InGaP layer (the bottom layer of the collector layer) of the prior art is 668 nm.

The carrier concentration and thickness of the InGaP layer at the bottom layer of the collector layer of both are $1\times10^{17}/cm^3$ and 2000 Å, respectively. In addition, the material of the middle layer of both is GaAs, and the thickness and carrier concentration thereof are about 50 Å and $3\times10^{18}/cm^3$, respectively. The material of the top layer of both is GaAs, and the thickness and carrier concentration thereof are about 7000 Å and $1\times10^{16}/cm^3$, respectively.

As shown in FIGS. 11 and 12, when the bottom layer of the collector layer is a InGaP layer with lower ordering effect, the carrier concentration between the top layer and the middle layer is significantly higher, and the knee voltage is also significantly lower.

Figure 13:
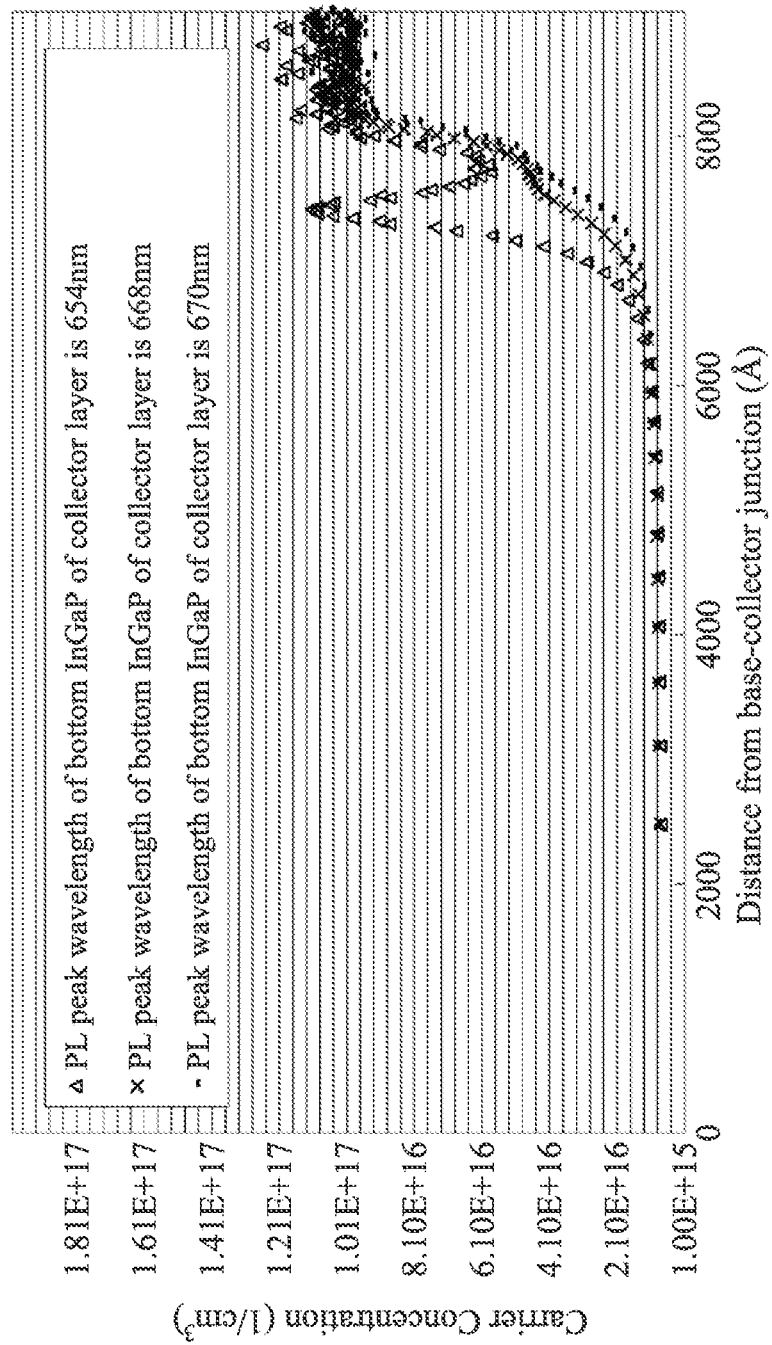
FIG. 13 is a comparison diagram showing the carrier concentration distribution of the collector layer of the HBT of the present disclosure and the carrier concentration distributions of the collector layers of two prior art HBTs.
Figure 14:
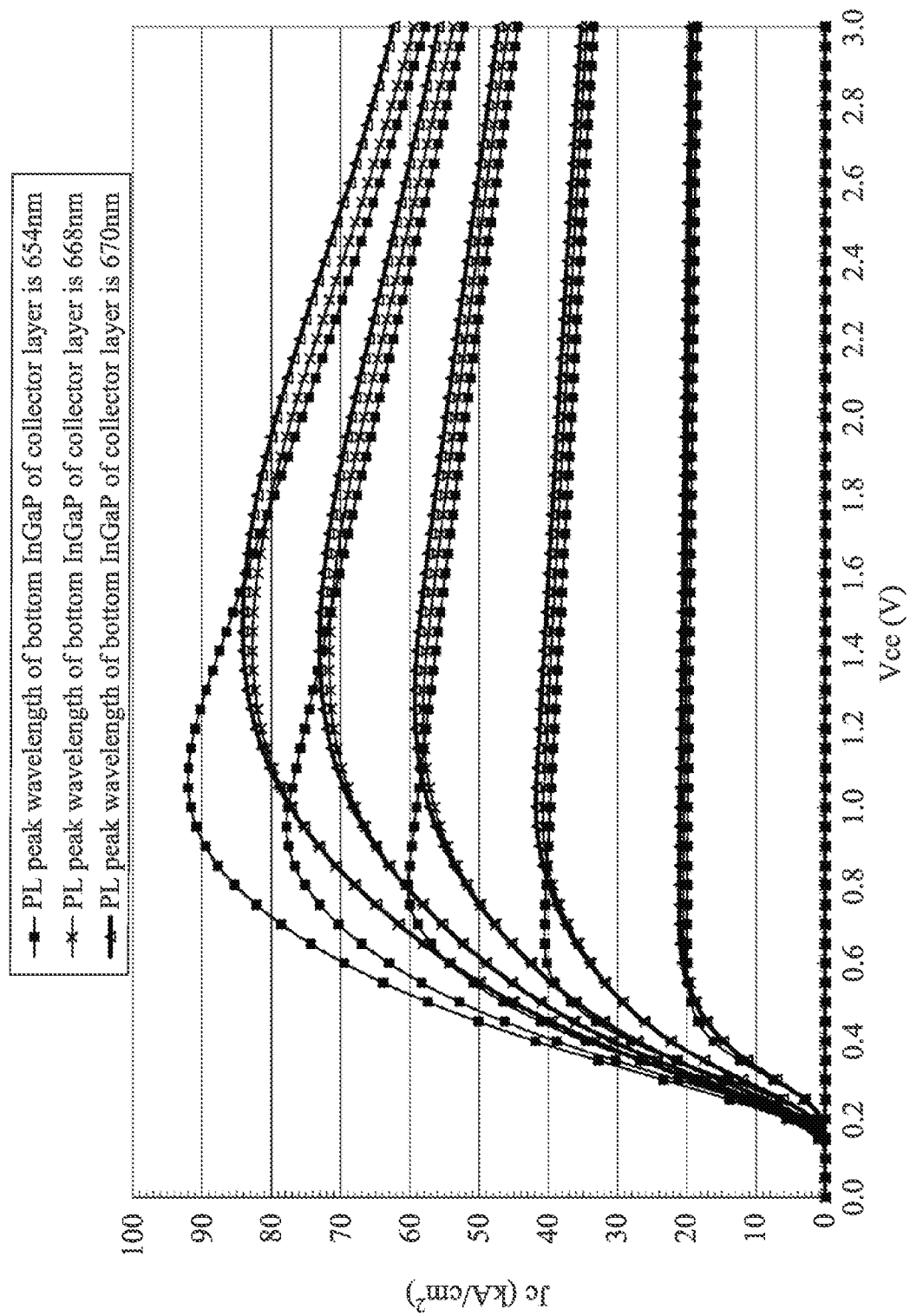
FIG. 14 is comparison diagram showing the I-V characteristics of the common emitter of the collector layer of the HBT of the present disclosure and the I-V characteristics of the common emitter of the collector layers of two prior art HBTs.

FIG. 13 is a comparison diagram showing the carrier concentration distribution of the collector layer of the HBT of an embodiment of the present disclosure and the carrier concentration distributions of the collector layers of two prior art HBTs. The diagram of the carrier concentration distribution of the collector layer is measured by the C-V measurement method. FIG. 14 is comparison diagram showing the I-V characteristics of the common emitter of the collector layer of the HBT of an embodiment of the present disclosure and the I-V characteristics of the common emitter of the collector layers of two prior art HBTs. The structure of the HBT of an embodiment of the present disclosure is the same structure as the structures of the HBTs of the prior arts, as shown in FIG. 4. The present disclosure is different from the prior arts only in the degree of ordering effect of the InGaP layer at the bottom layer of the collector layer. Wherein, the PL peak wavelength of the InGaP layer in the embodiment of the present disclosure is 654 nm (the bottom layer of the collector layer), while the PL peak wavelengths of the InGaP layers (the bottom layer of the collector layer) of the prior arts are 668 nm and 670 nm, respectively.

The carrier concentration and thickness of the InGaP layer at the bottom layer of the collector layer of the three are $1\times10^{17}/cm^3$ and 2000 Å, respectively. In addition, the material of the middle layer of the three (i.e., the middle layer of the present disclosure and two middle layers of the prior art) is GaAs, and the thickness and carrier concentration thereof are about 50 Å and $1.5\times10^{18}/cm^3$, respectively. The material of the top layer of the three is GaAs, and the thickness and carrier concentration thereof are about 7000 Å and $8\times10^{15}/cm^3$, respectively.

As shown in FIGS. 13 and 14, when the bottom layer of the collector layer is a InGaP layer with lower ordering effect, even if the doping concentration of the middle layer is low, the carrier concentration between the top layer and the middle layer is still high, and the knee voltage is still low.

In one embodiment, the high ruggedness HBT structure can further include an intermediate composite layer (not shown), which is formed between the substrate 10 and the sub-collector layer 20, and is made of a semiconductor material.

In an embodiment, the intermediate composite layer includes at least one buffer layer, and the buffer is made of a III-V semiconductor material.

In an embodiment, the intermediate composite layer includes a field-effect transistor.

In an embodiment, the intermediate composite layer includes a pseudomorphic high electron mobility transistor, which is sequentially stacked on the substrate (not shown), including: at least one buffer layer, a first donor layer, a first spacer layer, a channel layer, a second spacer layer, a second donor layer, a Schottky layer, an etch stop layer and a cap layer for ohmic contact. The material of the buffer layer is selected from a III-V semiconductor material. The material of the first donor layer or the second donor layer is selected from the group consisting of N-type semiconductor materials of GaAs, AlGaAs, InAlGaP, InGaP and InGaAsP. The material of the first spacer layer or the second spacer layer is selected from the group consisting of semiconductor materials of GaAs, AlGaAs, InAlGaP, InGaP and InGaAsP. The material of the channel layer is selected from the group consisting of semiconductor materials of GaAs, InGaAs, AlGaAs, InAlGaP, InGaP and InGaAsP. The material of the Schottky layer is selected from the group consisting of semiconductor materials of GaAs, AlGaAs, InAlGaP, InGaP and InGaAsP. The material of the etch stop layer is selected from the group consisting of semiconductor materials of GaAs, AlGaAs, InAlGaP, InGaAsP, InGaP and AlAs. The material of the cap layer is selected from an N-type III-V semiconductor material.

The features of several embodiments are summarized above such that persons skilled in the art can better under the aspects of the present disclosure. Persons skilled in the art should understand that persons skilled in the art can easily use the present disclosure as a basis for designing or modifying other processes and structures. These other processes and structures are used to perform the same purpose of the embodiments introduced herein and/or achieve the same advantages of the embodiments. Persons skilled in the art should also understand that the equivalent structures do not depart from the spirit and scope of the present disclosure. Persons skilled in the art can make various changes, substitutions or alterations without departing from the spirit and scope of the present disclosure.

What is claimed is:

1. A high ruggedness heterojunction bipolar transistor, comprising:
   a substrate;
   a sub-collector layer being on the substrate and comprising an N-type III-V semiconductor material;
   a collector layer being on the sub-collector layer and comprising a III-V semiconductor material, wherein the collector layer comprises a wide bandgap layer that is directly or indirectly adjacent to the sub-collector layer, the wide bandgap layer comprises a material selected from the group consisting of InGaPN, InGaPSb, InGaPBi, InGaAsP, InGaAsPN, InGaAsPSb, InGaAsPBi, InAlGaP, InAlGaPN, InAlGaPSb, and InAlGaPBi, and a bandgap of the wide bandgap layer is greater than that of GaAs;
   a base layer being on the collector layer and comprising a P-type III-V semiconductor material;
   an emitter layer being on the base layer and comprising an N-type III-V semiconductor material; and
   an InGaP layer, wherein the InGaP layer is formed above and/or below the wide bandgap layer, and the bandgap of the InGaP layer is greater than 1.86 eV, or a photoluminescence peak wavelength of the InGaP layer is less than 667 nm.

2. The high ruggedness heterojunction bipolar transistor as claimed in claim 1, wherein the collector layer further comprises a GaAs layer, and the GaAs layer is directly formed on the wide bandgap layer.

3. The high ruggedness heterojunction bipolar transistor as claimed in claim 1, wherein the ratio of a thickness of the wide bandgap layer to a thickness of the collector layer is between 1 and 0.01.

4. The high ruggedness heterojunction bipolar transistor as claimed in claim 1, wherein the collector layer further comprises a middle layer and a top layer sequentially formed on the wide bandgap layer, and a doping concentration of the middle layer is higher than that of the top layer.

5. The high ruggedness heterojunction bipolar transistor as claimed in claim 4, wherein the middle layer comprises a material selected from the group consisting of GaAs, InGaP, InGaPN, InGaPSb, InGaPBi, InGaAsP, InGaAsPN, InGaAsPSb, InGaAsPBi, InAlGaP, InAlGaPN, InAlGaPSb and InAlGaPBi.

6. The high ruggedness heterojunction bipolar transistor as claimed in claim 4, wherein the middle layer has a graded concentration, and the graded concentration means that the closer to the wide bandgap layer, the higher the doping concentration is.

7. The high ruggedness heterojunction bipolar transistor as claimed in claim 1, further comprising a bandgap graded layer formed in the collector layer or on the collector layer.

8. The high ruggedness heterojunction bipolar transistor as claimed in claim 1, wherein the wide bandgap layer has a graded concentration, and the graded concentration means that the closer to the sub-collector layer, the higher the doping concentration is.

9. The high ruggedness heterojunction bipolar transistor as claimed in claim 1, further comprising an intermediate composite layer being between the substrate and the sub-collector layer.

10. The high ruggedness heterojunction bipolar transistor as claimed in claim 9, wherein the intermediate composite layer comprises a buffer layer, a field-effect transistor or a pseudomorphic high electron mobility transistor, wherein the buffer layer is made of a III-V semiconductor material.

11. A high ruggedness heterojunction bipolar transistor, comprising:
   a substrate;
   a sub-collector layer being on the substrate and comprising an N-type III-V semiconductor material;
   a collector layer being on the sub-collector layer and comprising a III-V semiconductor material, wherein the collector layer comprises a wide bandgap layer that is directly or indirectly adjacent to the sub-collector layer, the wide bandgap layer comprises a material selected from the group consisting of InGaPN, InGaPSb, InGaPBi, InGaAsP, InGaAsPN, InGaAsPSb, InGaAsPBi, InAlGaP, InAlGaPN, InAlGaPSb, and InAlGaPBi, and a bandgap of the wide bandgap layer is greater than that of GaAs;
   a base layer being on the collector layer and comprising a P-type III-V semiconductor material;
   an emitter layer being on the base layer and comprising an N-type III-V semiconductor material; and
   a bandgap graded layer formed in the collector layer or on the collector layer.

12. The high ruggedness heterojunction bipolar transistor as claimed in claim 11, wherein the collector layer further comprises a GaAs layer, and the GaAs layer is directly formed on the wide bandgap layer.

13. The high ruggedness heterojunction bipolar transistor as claimed in claim 11, wherein the ratio of a thickness of the wide bandgap layer to a thickness of the collector layer is between 1 and 0.01.

14. The high ruggedness heterojunction bipolar transistor as claimed in claim 11, wherein the collector layer further comprises a middle layer and a top layer sequentially formed on the wide bandgap layer, and a doping concentration of the middle layer is higher than that of the top layer.

15. The high ruggedness heterojunction bipolar transistor as claimed in claim 14, wherein the middle layer comprises a material selected from the group consisting of GaAs, InGaP, InGaPN, InGaPSb, InGaPBi, InGaAsP, InGaAsPN, InGaAsPSb, InGaAsPBi, InAlGaP, InAlGaPN, InAlGaPSb and InAlGaPBi.

16. The high ruggedness heterojunction bipolar transistor as claimed in claim 14, wherein the middle layer has a graded concentration, and the graded concentration means that the closer to the wide bandgap layer, the higher the doping concentration is.

17. The high ruggedness heterojunction bipolar transistor as claimed in claim 11, wherein the wide bandgap layer has a graded concentration, and the graded concentration means that the closer to the sub-collector layer, the higher the doping concentration is.

18. The high ruggedness heterojunction bipolar transistor as claimed in claim 11, further comprising an intermediate composite layer being between the substrate and the sub-collector layer.

19. The high ruggedness heterojunction bipolar transistor as claimed in claim 18, wherein the intermediate composite layer comprises a buffer layer, a field-effect transistor or a pseudomorphic high electron mobility transistor, wherein the buffer layer is made of a III-V semiconductor material.

* * * * *